Figure 1:
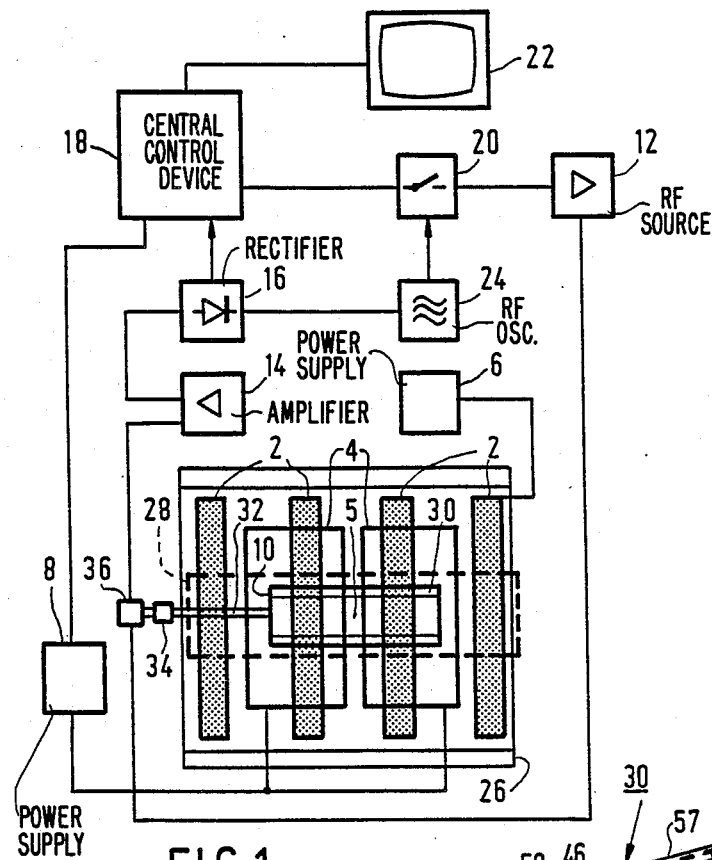

United States Patent [19]

Van Vaals

[11] Patent Number: 4,910,461
[45] Date of Patent: Mar. 20, 1990

[54] MAGNETIC RESONANCE IMAGING APPARATUS INCLUDING AN INTERFERENCE-POOR R.F. COIL

[75] Inventor: Johannes J. Van Vaals, Eindhoven, Netherlands

[73] Assignee: U.S. Philips Corporation, New York, N.Y.

[21] Appl. No.: 267,693

[22] Filed: Nov. 2, 1988

Related U.S. Application Data

[63] Continuation of Ser. No. 161,333, Feb. 19, 1988, abandoned, which is a continuation of Ser. No. 1,295, Jan. 7, 1987, abandoned.

[30] Foreign Application Priority Data

Mar. 21, 1986 [NL] Netherlands ............... 8600730

[51] Int. Cl.$^4$ ............................................ G01R 33/20
[52] U.S. Cl. ................................... 324/318; 324/322
[58] Field of Search .................. 324/316, 318, 322; 336/84 C, 95; 333/219, 245; 343/741, 742, 841, 842

[56] References Cited

U.S. PATENT DOCUMENTS

| | | | |
|---|---|---|---|
| 2,349,154 | 5/1944 | Finch | 343/842 |
| 4,439,733 | 3/1984 | Hinshaw et al. | 324/322 |
| 4,605,899 | 8/1986 | Eumurian et al. | 343/842 |
| 4,616,181 | 10/1986 | Kemner et al. | 324/318 |
| 4,700,137 | 10/1987 | Yoda et al. | 324/322 |
| 4,712,067 | 12/1987 | Roschmann et al. | 324/318 |

OTHER PUBLICATIONS

Ramo, S. et al., "Fields and Waves in Communication Electronics", 2nd Ed., (1984), pp. 238–247.

Primary Examiner—Hezron E. Williams
Assistant Examiner—Louis M. Arana
Attorney, Agent, or Firm—Thomas A. Briody; Jack E. Haken; Jack D. Slobod

[57] ABSTRACT

A magnetic resonance imaging apparatus includes an r.f. coil which is comprised of a number (for example, two in the case of a surface coil and four in the case of a cylindrical coil) of coaxial cables. The outer jackets of the cables are arranged so as to form a sleeve enclosing the core or center portion at the area of a node in the electric field. By keeping lead-out portions of the cables outside the sleeve, a highly interference free coil is obtained. The total cable length amounts to, for example, $\frac{3}{4}\lambda$, with $\frac{1}{4}\lambda$ as a lead out portion and $0.1\lambda$ as a sleeve core defining the coil circumference.

8 Claims, 1 Drawing Sheet

MAGNETIC RESONANCE IMAGING APPARATUS INCLUDING AN INTERFERENCE-POOR R.F. COIL

This is a continuation of application Ser. No. 161,333, filed Feb. 19, 1988, now abandoned which was a continuation of Ser. No. 001,295 filed Jan. 7, 1987, now abandoned.

The invention relates to a magnetic resonance imaging apparatus which includes a magnet system for generating a steady magnetic field in a measurement space and which also includes an r.f. coil which is to be arranged in the measurement space, and also relates to an r.f. coil for such an apparatus.

An apparatus of this kind is known from EP No. 105 550. In particular for higher resonant frequencies, for example in excess of 100 MHz, disturbing delay time effects occur in conventional r.f. coils due to the comparatively short wavelength of the r.f. field, so that the field homogeneity is affected. Furthermore, dielectric losses in measurement objects often reduce the quality factor of the coil, thus reducing the signal quality. The resonant frequency of the r.f. coil, moreover, is highly dependent on the measurement object and is limited by parasitic capacitances of the coil. Furthermore, comparatively high electric potentials often occur across the r.f. coil, as well as across a tuning element to be connected thereto, so that disturbing electric discharges are liable to occur. Moreover, disturbance of the homogeneity of the measurement field due to Eddy currents occurring in coil elements becomes increasingly severe, notably at higher mesurement frequencies.

It is the object of the invention to mitigate these drawbacks. To achieve this, a magnetic resonance imaging apparatus of the kind set forth above, in accordance with the invention is characterized in that the r.f. coil includes coaxial cables whose outer conductor is locally widened or spread apart at the area of a node in the electric field over a distance which defines the coil circumference. The widened portion thus forms an electric shielding sleeve which encloses the core conductors at that area.

Because a voltage node occurs in the standing wave generated in the coil at the area of the local shielding sleeve in an r.f. coil in accordance with the invention and because the core conductors are shielded at that area, the electric field in the effective coil portion will be small, so that dielectric losses are reduced. Because of the absence of closed conductors, Eddy currents are also reduced.

The r.f. coil in a preferred embodiment includes at least four parallel-connected coaxial cables which are pair-wise connected in phase and in anti-phase for the standing wave and which extend substantially parallel to a cylinder axis across a cylindrical surface. The outer conductors of the cables form, at the area of a node in the electric field, measured in the axial direction, a shielding sleeve which is situated outside the cylindrical surface and which may be constructed as a gause or a composition of partly overlapping, mutually isolated sheets in order to reduce Eddy currents therein. With a coil of this construction, an extremely homogeneous excitation measurement field can be realized in which dielectric losses which disturb the coil quality will not occur because of the weak electric field at that area. In the case of an overall length of each of the coaxial cables which is equal to or preferably slightly larger than n/4 λ, n being an odd integer, and open cable ends behind the local widened portion, the widened portion is provided at approximately ¼ λ from the open ends and extends over a distance of, for example approximately 0.1 λ. In the case of short-circuited cable ends, the location of the widened portion is situated at a distance of ½ λ from those ends and the length thereof, measured in the direction of the cable, is the same but the overall cable length amounts to n/2 λ, n being an integer. A favourable coil diameter is determined, for example so that a sleeve length of 0.1 λ corresponds to approximately twice that diameter.

In order to tune such an r.f. coil the coaxial cables are connected at one end to a tuning capacitor unit which may be situated, considering the desired cable length, a distance in front of the sleeve of the actual coil such as to preclude interferring fields within the measurement field. When the cable length between the tuning unit and the sleeve is suitably chosen, the potential across the tuning device can be minimized.

The r.f. coil in a further preferred embodiment includes at least two sets of coaxial cables so that, using an adapted mutual orientation and activation of the sets, a coil system can be realized for two different frequency ranges, or a first set can be used as an excitation coil while a second set is used as a measurement coil. In the latter case the coils can be oriented with respect to each other so that a quadrature coil arrangement is realised. Thus, mutual influencing of electronic circuitry to be connected to the coil for excitation and detection can be avoided. In practice two sets of cables will usually be arranged so as to be rotated through 90° with respect to one another.

Figure 2:
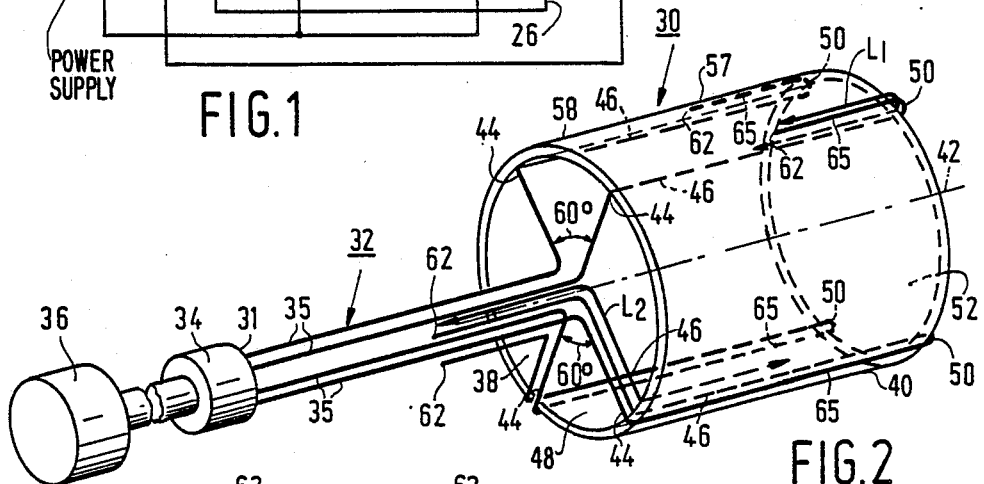
Figure 2A:
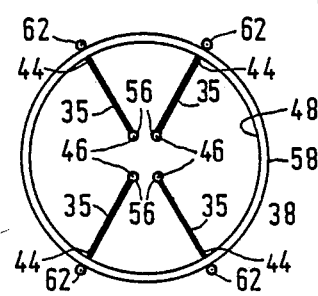

Some preferred embodiments in accordance with the invention will be described in detail hereinafter with reference to the drawing, wherein:

FIG. 1 shows a magnetic resonance imaging apparatus in accordance with the invention, and FIGS. 2 and 2a shows an r.f. coil to be used therein.

A magnetic resonance imaging apparatus shown in FIG. 1 includes magnet coils 2 for generating a uniform, steady magnetic field, magnet coils 4 for generating a gradient field in a measurement space 5 enclosed by the coils, a power supply source 6 for the magnet coils 2, and a power supply source 8 for the magnet coils 4. An r.f. coil 10 is arranged in the measurement space 5. Coil 10 serves for generating an r.f. electromagnetic field and is connected to an r.f. source 12. In this case, coil 10 is also used for detecting spin resonance signals generated by the r.f. field in an object to be measured. For detection, the coil 10 is connected to a signal amplifier 14. The signal amplifier 14 is connected to a phase-sensitive rectifier 16 which is connected to a central control device 18. The central control device 18 also controls a modulator 20 for the r.f. source 12, the power supply source 8 for the gradient field, and a monitor 22 for image display. An r.f. oscillator 24 controls the modulator 20 for the r.f. source 12 as well as the phase-sensitive rectifier 16 which processes the measurement signals. A helium dewar vessel 26 which encloses the magnet coils serves for cooling the magnet coils for the main field. The invention can be used notably, but not exclusively, for superconducting magnets, because in such cases comparatively strong magnetic fields and hence comparatively high spin resonance frequencies are used. A Faraday cage 28 encloses the measurement space 5 in the apparatus and surrounds the transmitter/receiver coil 10. Cage 28 is situated within the coils 2 and 4 for the main magnetic field. This cage could be dispensed with, however, due to the fact that the outer portions of the cables locally form a cage-like structure.

An effective portion 30 of the r.f. coil 10 is situated within the measurement space 5 and power supply cable portions 32 may be fed out of this area. The power supply cables 32 are connected to a tuning unit 34 which may be situated outside the measurement space. A selector 36 is connected to the tuning unit. Due to the cable lengths to be chosen, the location of the selector 36 is arbitrary so that it can be mounted well apart from the magnetic fields. The selector 36 connects the coil either to the r.f. source 12 for excitation of an object situated within the measurement field of the coil, or to the signal amplifier 14 for the detection of relaxation signals generated in the object.

FIG. 2 is a more detailed representation of the coil 10 with an effective coil portion 30, power supply cables 32, a tuning unit 34 and a selector 36.

In the embodiment shown, four coaxial cables 35 extend as a bundle from a connection pad 31 of the tuning unit 34 to the coil portion 30. In the present embodiment the cables extend pair-wise at an angle of 60° across an entrance plane 38 of an a cylinder 40 having an axis 42 and reach points 44 adjacent the inner surface 48 of the cylinder 40. Core or center conductors 46 of the cables extend from the points 44 along the inner surface 48 of the cylinder 40 to points 50 at the opposite end plane 52. At the entrance plane 38 outer conductor portions 56 of the coaxial cables terminate at the outer surface 58 of the cylinder 40 so as to form a common shielding sleeve 57. In the end plane 52 the inner conductors 46 bend around the end of the sleeve 57 and are again encased by conductor portions 56 to form lead-out coaxial cable portions 65. In this case the leadout portions are returned so as to extend outside the sleeve 57 and terminate in open ends 62.

Measured from the connection pad 31 to the ends 62, the cables have an electrical length which is slightly larger than or at least equal to $n/4\ \lambda$, where n is an odd integer, $\lambda$ is the wavelength applicable to the resonant frequency, when the ends 62 are open, that is to say when no connection is made at this area between the core conductors and the sleeve. The cables of each pair have the same electrical length which is expressed by the indicated course of notably the supply cables. However, as long as their total length remains the same, the course individual of the supply cables may be different, for example partly along a cylindrical circumference of the cylinder 40. Comparatively speaking the length of the supply cables shown between the pad 31 and the plane 38 is too short for many practical applications, because, for example, for an overall cable electrical length of $\frac{3}{4}\ \lambda$, (n=3) and a desired electrical length of $\frac{1}{4}\ \lambda$ for the lead-out cable portions 65, the supply portions amount to approximately $\frac{1}{2}\ \lambda$, with approximately $0.1\ \lambda$ for the coil length along axis 2.

When the ends 62 of the cables are short circuited, the overall electrical cable length amounts to slightly more than $n/2\ \lambda$, n being an integer, while the lead-out cable portions 65 amount to $\frac{1}{2}\ \lambda$, so that for n=2, a length of $\frac{1}{2}\ \lambda$ remains for the supply cables 35. All electrical cable lengths of lead-out portions 65 are measured from the center of the coil 30 and along the core conductor 46 in the paths illustrated as L1 and L2 in FIG. 2.

With a second set of cables is added which is rotated through 90° with respect to the first set across the cylindrical portion, an increased field homogeneity can be achieved for given applications with the same excitation and detection. It is then also possible to measure with different tuning adjustments, i.e. connection to different tuning capacitor units, for two different frequencies. Alternatively a first set can be used as an excitation coil and the second set as a detection coil, potentially in a quadrature orientation. Similarly, more than two sets can be used with any desired combination of functions for the various sets. Should the lead-out cable portions 65 become inconvenient or impractically long in the case of comparatively low frequencies, the cables can also be terminated by means of a lumped connection, that is to say an L-C circuit which electrically simulates the open or short circuited $\frac{1}{4}\ \lambda$ or $\frac{1}{2}\ \lambda$ lead-out portion.

Using two cables which extend to diametrically situated points in the plane 38, a surface coil can be realised. The center conductors 46 may then also extend circularly and near one another on both sides. The sleeve 57 then encloses this circle and hence a surface defined thereby; it can be extended as desired in a direction perpendicular to said plane. For rectangular surface coils, the two reversing points 50 can be combined so as to form substantially a common point near the axis 42. The lead-out portions of the coaxial cables are then returned again outside the shielding sleeve and are in any case optimally shielded from the measurement field. Similarly, use can then also be made of several, for example mutually orthogonally oriented cable pairs which form more or less mutually coupled surface coils. An example of such a coil is the surface coil, known as a butterfly coil described in U.S. application Ser. No. 908,464, filed Sept. 17, 1986.

Although the forgoing description is based on 2, 4 or more sets of cables, the invention is by no means restricted thereto. To the contrary, it is an additional advantage of the invention that an arbitrary number of cables can be used, for example for bird-cage coils, with, for example 8, 12 of 16 cables surface coils can also be realized witha single cable whose core is partly divided into two wires enclosing the cable surface. Using more cables, the direction of the field can be chosen by activating both cables in phase for a field parallel to the surface or in anti-phase for a field perpendicular to the surface without it being necessary to arrange any electrical circuit element whatsoever within the shielding sleeve.

What is claimed is:

1. In a magnetic resonance imaging apparatus including a magnet system for generating a substantially steady magnetic field along a central axis in a measurement space, RF coil apparatus comprising:

a connection pad proximate said measurement space for excitation with an RF source at a resonance frequency;

a generally cylindrical unitary conductor shield within said measurement space directed axially from a first transverse end plane to a second transverse end plane;

a first pair of separate coaxial cable feed portions extending from said connection pad to said first end plane, each said coaxial cable feed portion having a center conductor and an individual outer conductor shield, the center conductors of said feed portions being respectively individually fed at said connection pad;

the individual outer conductor shields of said feed portions being connected at said first end plane to said generally cylindrical unitary conductor shield;

said center conductor having individual outer conductor shields removed so as to form non-individually shielded portions extending from the first end plane to the second end plane within said unitary conductor shield parallel to the central axis and transversely spaced apart from each other, said center conductors at said second coil end plane respectively comprising the center conductors of a pair of individual coaxial cable lead-out portions, each said individual coaxial cable lead-out portion having an individual outer conductor shield which is connected to said unitary conductor shield, and separate means terminating each of said coaxial cable lead-out portions so as to produce a standing wave transverse electric field varying along the length of each center conductor, the length of each lead-out portion and each said termination means being selected to produce a node in the standing wave electric field on the non-individually shielded portion of each center conductor within said unitary conductor shield.

2. The apparatus of claim 1, wherein each said termination means and each said lead-out portion length is selected to produce each said node within said unitary conductor shield, substantially midway between said first and second shield end planes.

3. The apparatus of claim 1, wherein said termination means for one of said lead-out portions is an open circuit and the length of said lead-out portion is chosen so that there is an electrical length of $\lambda/4$ measured between said termination means and a point on said center conductor within said unitary conductor shield substantially midway between said first and second end planes, where $\lambda$ is the resonant frequency wavelength.

4. The apparatus of claim 2, wherein said termination means for one of said lead-out portions is a closed-circuit and the length of said lead-out portion is chosen so that there is an electrical length of $\lambda/2$ measured between said termination means and a point on said center conductor within said unitary conductor shield substantially midway between said first and second shield end planes, where $\lambda$ is the resonant frequency wavelength.

5. The apparatus of claim 3 wherein the overall electrical length of said coaxial cable having a lead-out portion with a termination means being an open-circuit, measured from said connection pad to the end of said lead-out portion is $n\lambda/4$, where n is an odd integer.

6. The apparatus of claim 4 wherein the overall electrical length of said coaxial cable having a lead-out portion with a termination means being a closed-circuit, measured from said connection pad to the end of said lead-out portion is $n\lambda/4$, where n is an even integer.

7. The apparatus according to any of claims 1-4, further comprising a second pair of separate coaxial cable feed portions extending to said first end plane, having their center conductors extending non-individually shielded, within said unitary conductor shield, parallel to the central axis and transversely spaced apart from each other and from said non-individually shielded portions of the center conductors of said first coaxial cable feed portions, having their own coaxial cable lead-out portions and termination means.

8. A magnetic resonance imaging apparatus according to claims 1, 2, 3, or 4 wherein the electrical length of the non-individually shielded portion of each center conductor within said unitary conductor shield is approximately 0.1 $\lambda$ and approximately between 1 and 2 times the diameter of said unitary conductor shield, where $\lambda$ is the resonant frequency wavelength.

* * * * *